United States Patent
Wu et al.

(10) Patent No.: US 8,766,698 B2
(45) Date of Patent: Jul. 1, 2014

(54) RETURN-TYPE CURRENT-REUSE MIXER

(75) Inventors: Jianhui Wu, Jiangsu (CN); Chao Chen, Jiangsu (CN); Hong Li, Jiangsu (CN); Longxing Shi, Jiangsu (CN); Zixuan Wang, Jiangsu (CN); Jie Sun, Jiangsu (CN); Zhiyi Ye, Jiangsu (CN); Meng Zhang, Jiangsu (CN)

(73) Assignee: Southeast University (CN)

( * ) Notice: Subject to any disclaimer, the term of this patent is extended or adjusted under 35 U.S.C. 154(b) by 0 days.

(21) Appl. No.: 13/978,864

(22) PCT Filed: Aug. 18, 2011

(86) PCT No.: PCT/CN2011/078565
§ 371 (c)(1),
(2), (4) Date: Jul. 11, 2013

(87) PCT Pub. No.: WO2012/094892
PCT Pub. Date: Jul. 19, 2012

(65) Prior Publication Data
US 2013/0300490 A1 Nov. 14, 2013

(30) Foreign Application Priority Data

Jan. 11, 2011 (CN) .......................... 2011 1 0004140

(51) Int. Cl.
*G06G 7/12* (2006.01)
*G06F 7/44* (2006.01)

(52) U.S. Cl.
USPC ............ 327/356; 327/359; 455/323; 455/326

(58) Field of Classification Search
USPC .......................... 327/355–361; 455/323, 326
See application file for complete search history.

(56) References Cited

U.S. PATENT DOCUMENTS

| | | | | |
|---|---|---|---|---|
| 6,157,822 A | * | 12/2000 | Bastani et al. | ................ 455/323 |
| 7,911,276 B1 | * | 3/2011 | Zeller | ........................... 330/300 |
| 7,952,430 B1 | * | 5/2011 | Beffa | ............................... 330/86 |
| 8,112,059 B2 | * | 2/2012 | Beffa | ........................... 455/326 |
| 8,149,955 B2 | * | 4/2012 | Tired | ........................... 375/318 |

FOREIGN PATENT DOCUMENTS

| | | |
|---|---|---|
| CN | 101902202 | 12/2010 |
| CN | 102111109 | 6/2011 |
| JP | 60121804 | 6/1985 |
| JP | 60127808 | 7/1985 |

OTHER PUBLICATIONS

International Search Report for PCT/CN2011/078565, English translation attached to original, Both completed by the Chinese Patent Office on Sep. 28, 2011, All together 5 Pages.

* cited by examiner

*Primary Examiner* — Dinh T. Le
(74) *Attorney, Agent, or Firm* — Brooks Kushman P.C.

(57) ABSTRACT

A return-type current-reuse mixer having a transconductance/amplification stage, a mixing stage, and a high-pass and a low-pass filter network. The transconductance/amplification stage has a current-reuse CMOS topology wherein an input frequency signal is converted into a frequency current, low-frequency components are removed from the frequency current by the high-pass filter network, the frequency current is fed into the mixing stage, modulation occurs in the mixing stage, and then an intermediate-frequency signal is generated and output. Once high-frequency components are removed from the intermediate-frequency signal by the low-pass filter network, the intermediate-frequency signal is sent again for input into the transconductance/amplification stage, then amplified in the transconductance/amplification stage and output. The mixer transconductance/amplification stage employs a current-reuse technique. The input frequency and the output intermediate-frequency signal share a common transconductance/amplification stage. The mixer reduces power consumption, simplifies the circuit topology, and provides high conversion gain.

8 Claims, 2 Drawing Sheets

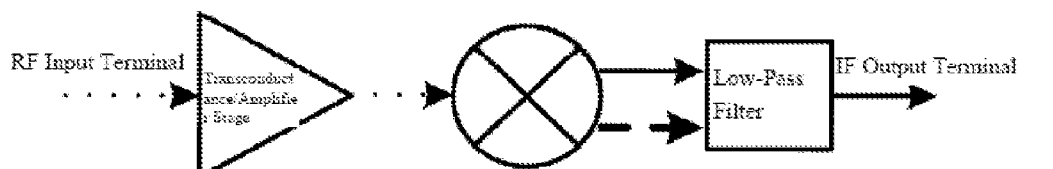
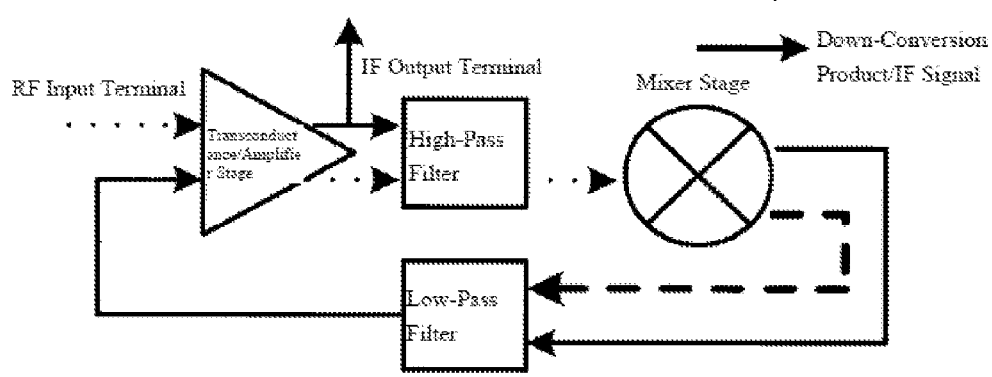
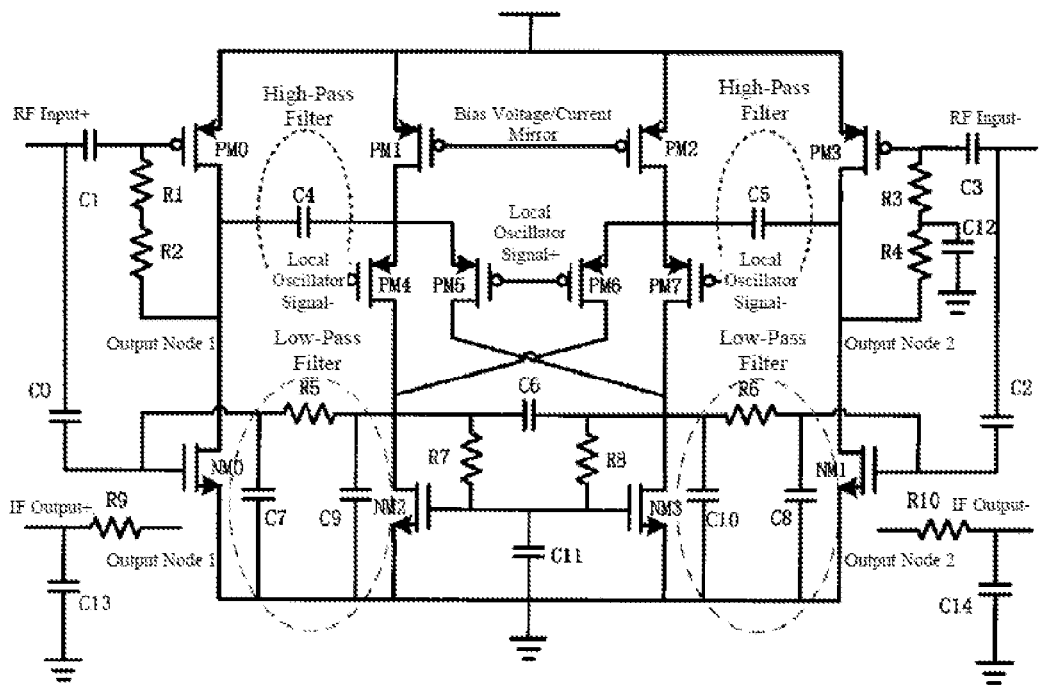
Figure 2

RETURN-TYPE CURRENT-REUSE MIXER

CROSS-REFERENCE TO RELATED APPLICATION

This application is the U.S. national phase of PCT Application No. PCT/CN2011/078565 filed on Aug. 18, 2011, which claims priority to Chinese Patent Application No. 201110004140.2 filed on Jan. 11, 2011, the disclosures of which are incorporated in their entirety by reference herein.

FIELD OF THE INVENTION

The present invention relates to a return-type current reuse frequency mixer, which contains a transconductance/amplifier stage and a mixer stage. Radio frequency signal is down converted into intermediate frequency signal via transconductance stage and mixer stage, and then is fed back to the transconductance stage for intermediate frequency amplification; the amplified signal is output after being filtered by a first-order low-pass filter. The transconductance stage of the frequency mixer amplifies both the input radio frequency signal and output intermediate frequency signal; to ensure circuit stability, the radio frequency signal/intermediate frequency signal are coupled and isolated by means of low-pass/high-pass filter networks. The structure has advantages of reduced power consumption, simplified circuit structure and high conversion gain, and is applicable to low-power and low-cost constant-envelope communication standard.

BACKGROUND OF THE INVENTION

Return-type circuit is based on regenerative circuit. Regenerative circuit technology emerged in early-stage vacuum tube receivers first. Owing to the high price of vacuum tubes at that time, receiver designers began to seek paths for building the entire receiver with least number of vacuum tubes. An American Edwin Armstrong invented regenerative circuit, which made the implementation of single tube receiver possible. The working principle of regenerative circuit is: under the amplification and nonlinear actions of vacuum tube, an signal that contains amplified radio frequency signal and demodulated audio signal is output by radio frequency broadcast signal, and a part of the output signal is fed back to the input terminal of the vacuum tube again for amplification by means of positive feedback technology; in that way, oscillation of input signal occurs at the input terminal of the vacuum tube, and thereby the input radio frequency signal is "regenerated". Since the oscillation tends to saturate, the ultimate amplitude of oscillation is fixed and the amplitude of output demodulated audio signal is also fixed for input signals with different intensities; the receiving volume is almost the same for radio stations with different intensities; therefore, the volume control process can be omitted. It is noted that the oscillation process should surely not be endless. In the circuit, the oscillation signal can be "reset" automatically at a short interval, so that oscillation is restarted and maintained according to the input signal, in order to track and regenerate the input signal at any time. In summary, regenerative circuit allows for operating in an intermittent non-steady state. In many cases, the function of receiver can be implemented with a single tube. Regenerative circuit breaks the provisions of gain-bandwidth product being constant in a first-order approximation system, and increases the equivalent Q value of the receiving circuit. The intermediate frequency amplification tube can be omitted, and the cost of receiver can be reduced; in addition, the power consumption is reduced, though reduction of power consumption was not a concern at that time. However, regenerative circuit in its early stage also faced some problems, for example, the circuit will amplify the noise infinitely when there is no signal input, causing hissing noise from the speaker; the emitted oscillating signal will interfere with other receivers; some circuit knowledge is required to accomplish adjustment of regenerative circuit, and the frequency selectivity is poor, etc. Regenerative circuit emerged in the times when all possible efforts were made to save tubes. Though the performance of regenerative circuit is barely satisfactory, the design concept of regenerative circuit has brought a unique idea to the circuit designers.

The positive feedback of regenerative circuit was the main cause for the drawbacks, but the full utilization of amplifier tube brought inspirations to the designers later. In the following several years, the prototype of return-type structure was put forth, i.e., the input high-frequency signal and the output demodulated intermediate frequency signal share the same amplifier stage. To prevent the occurrence of positive feedback, the radio frequency signal and intermediate frequency signal were isolated by means of high-pass and low-pass filter networks at the same time. However, the maximum frequency of short-wave audio broadcast at that time was only several MHz to tens of MHz, which differed only by 2 to 3 orders from the output audio. Therefore, the effect of isolation between radio frequency signal and output intermediate frequency signal was poor, and the receiving quality was poor due to mutual interference. With the emergence and development of transistor technology, the cost of tube was greatly reduced, and receivers with superheterodyne structure began to popularize; in comparison, the cost advantage of regenerative structure and return-type structure no longer existed. Therefore, regenerative structure and return-type structure were forgotten for a long time.

At present, radio frequency communication circuits usually have carrier frequency as high as 2-5 GHz and output intermediate frequency within a range of 2-10 MHz. The radio frequency signal and intermediate frequency signal can be isolated effectively by means of a simple first-order passive filter network. As portable communication means and wireless sensing networks are widely applied, how to reduce power consumption and increase battery life has become a purpose of the designers. The concept of radio frequency/intermediate frequency gain reuse of return-type circuit provides an approach for reduction of power consumption. In the present invention, the concepts related with the forgotten regenerative return-type circuit are merged into the design of integrated circuits, and thereby a novel low-power return-type frequency mixer is built.

DISCLOSURE OF THE INVENTION

Technical Problem

The object of the present invention is to provide a low-power return-type frequency mixer, in which the transconductance stage employs current reuse technology, and the input radio frequency signal and output intermediate frequency signal share the same transconductance/amplifier stage, and therefore the low-power return-type frequency mixer has advantages of reduced power consumption, simplified circuit structure, and high conversion gain.

Technical Solution

The object of the present invention is attained by the following technical scheme: as shown in FIG. 1a, a conventional frequency mixer mainly comprises three modules connected in sequence, i.e., a transconductance stage, a mixer stage, and a low-pass filter stage. A radio frequency signal is converted into radio frequency current by means of the transconductance stage, the current generates down-converted signal which is located at intermediate frequency, input feed-through signal which is located at radio frequency and up-converted signal at the output terminal under the modulation action of the mixer stage. After above signals have passed the low-pass filter network, the feed-through signal and up-converted signal are filtered off, and the pure down-converted signal is obtained at the output terminal.

A return-type current reuse frequency mixer, comprising a transconductance/amplifier stage and a mixer stage connected in sequence, wherein, the transconductance/amplifier stage amplifies input radio frequency signal, and the amplified radio frequency signal passes through the mixer stage and produces output intermediate frequency signal; the intermediate frequency signal is fed back to the input terminal of the transconductance/amplifier stage again, and then serves as the final intermediate frequency signal output after amplified by the transconductance/amplifier stage;

a high-pass filter network is serially connected between the transconductance/amplifier stage and the mixer stage, to block the intermediate frequency signal; a low-pass filter network is serially connected between the output terminal of the mixer stage and the transconductance/amplifier stage, to block the radio frequency signal;

the transconductance/amplifier stage employs a current reuse structure, and serves as a transconductance stage for the radio frequency signal and an amplifier stage for the intermediate frequency signal.

Specifically, the transconductance/amplifier stage comprises: PMOS transistors PM0 and PM3; NMOS transistors NM0 and NM1; capacitors C0 and C1; capacitors C2 and C3; and, resistors R1, R2, R3 and R4;

PM0, NM0, PM3 and NM1 constitute a current reuse transconductance stage; NM0 and NM1 serve as the amplifier tubes for the output intermediate frequency signal simultaneously, and the final output signals are output from the drain electrodes of NM0 and NM1;

the mixer stage comprises: double balanced switches PM4, PM5, PM6, and PM7; PMOS transistors PM1 and PM2 that are used as bias transistors, wherein, PM4 to PM7 constitute the core mixer circuit, and current bias is provided by PM1 and PM2; and, NMOS transistors NM2 and NM3 that are used as mixing loads;

the DC bias voltage for the transconductance stage is provided by the gate voltage of NM2 and NM3; radio frequency coupling capacitors C4 and C5 are connected between the transconductance stage and mixer stage and serve as a high-pass filter network to couple the radio frequency signal and isolate the final intermediate frequency signal output;

the low-pass filter network comprises C6, R5, C7, C9, R6, C8 and C10, to couple the intermediate frequency signal output from the mixer stage to the transconductance/amplifier stage and isolate the radio frequency signal output from the mixer stage;

the upper pole plates of capacitors C0 and C1 are connected to the positive input signal terminal, and the lower pole plate of C1 is connected to the gate electrode of PM0; the lower pole plate of C0 is connected to the gate electrode of NM0; the upper pole plates of capacitors C2 and C3 are connected to the positive input signal terminal, and the lower pole plate of C3 is connected to the gate electrode of PM3; the lower pole plate of C2 is connected to the gate electrode of NM1;

the source electrode of PM0 is connected to the supply voltage, and the drain electrode of PM0 is connected to the drain electrode of NM0; the positive terminal of resistor R1 is connected to the gate electrode of PM0, the negative terminal of resistor R1 is connected to the positive terminal of resistor R2, and the negative terminal of R2 is connected to the drain electrode of PM0; the source electrode of PM3 is connected to the supply voltage, and the drain electrode of PM3 is connected to the drain electrode of NM1; the positive terminal of resistor R3 is connected to the gate electrode of PM3, the negative terminal of resistor R3 is connected to the positive terminal of R4, and the negative terminal of R4 is connected to the drain electrode of PM3; the negative terminal of R1 and the negative terminal of R3 are connected to the upper pole plate of capacitor C12 at the same time, and the lower pole plate of C12 is grounded;

the drain electrodes of NM0 and NM1 are grounded; the source electrodes of PM1 and PM2 are connected to the supply voltage, and the gate electrodes of PM1 and PM2 are connected to the gate voltage of a current mirror; the source electrodes of PM4 and PM5 are connected to the drain electrode of PM1, and the source electrodes of PM6 and PM7 are connected to the drain electrode of PM2; the positive terminal of local oscillator signal is connected to the gate electrodes of PM5 and PM6, and the negative terminal of local oscillator signal is connected to the gate electrodes of PM4 and PM7;

the source electrodes of NM2 and NM3 are grounded, the gate electrodes of NM2 and NM3 are connected to the upper pole plate of capacitor C11, and the lower pole plate of capacitor C11 is grounded; the drain electrode of NM2 is connected to the drain electrodes of PM4 and PM6; the drain electrode of NM3 is connected to the drain electrodes of PM5 and PM6;

the upper pole plate of capacitor C4 is connected to the drain electrode of PM0, and the lower pole plate of capacitor C4 is connected to the drain electrode of PM1; the upper pole plate of capacitor C5 is connected to the drain electrode of PM3, and the lower pole plate of capacitor C5 is connected to the drain electrode of PM2; the positive terminal of resistor R7 is connected to the drain electrode of NM2, and the negative terminal of resistor R7 is connected to the gate electrode of NM2; the positive terminal of R8 is connected to the drain electrode of NM3, and the negative terminal of R8 is connected to the gate electrode of NM3; the capacitor C6 is bridge-connected between the positive terminal of R7 and the positive terminal of R8; the upper pole plate of capacitor C9 is connected to the drain electrode of NM2, and the lower pole plate of C9 is grounded; the upper pole plate of capacitor C10 is connected to the drain electrode of NM3, and the lower pole plate of C10 is grounded; the positive terminal of resistor R5 is connected to the drain electrode of NM2, the negative terminal of R5 is connected to the gate electrode of NM0 and the upper pole plate of capacitor C7, and the lower pole plate of C7 is grounded; the positive terminal of resistor R6 is connected to the drain electrode of NM3, the negative terminal of R6 is connected to the gate electrode of NM1 and the upper pole plate of capacitor C8, and the lower pole plate of C8 is grounded;

the positive terminal of R9 is connected to an output node 1, the negative terminal of R9 is the positive terminal of intermediate frequency signal output and is connected to the upper pole plate of the capacitor C13, and the lower pole plate of C13 is grounded; the positive terminal of R10 is connected to an output node 2, the negative terminal of R10 is the negative terminal of intermediate frequency signal output and is connected to the upper pole plate of capacitor C14, and the lower pole plate of C14 is grounded; the output node 1 is placed at the negative terminal of resistor R2, and the output node 2 is placed at the negative terminal of resistor R4.

The working principle of the technical scheme is as follows:

As shown in FIG. 1b, in the return-type frequency mixer of the present invention, a high-pass filter network is serially connected between the transconductance stage and the mixer stage, and the output of the mixer stage is connected to a low-pass filter network and then coupled to the transconductance/amplifier stage. The signal is amplified by means of the transconductance/amplifier stage and then output. For the input radio frequency signal, the transconductance/amplifier stage is a current reuse transconductance stage; for the output intermediate frequency signal, the transconductance/amplifier stage serves as an intermediate frequency amplifier. Viewed from the physical structure, the output of the mixer stage is connected to the input of the transconductance/amplifier stage, to form a loop. However, owing to the intervention of the high-pass/low-pass filter networks, the radio frequency signal is blocked at the output terminal of the mixer stage, and the intermediate frequency signal is blocked at the output terminal of the transconductance stage. Actually, no feed-back loop is formed. Since there is a difference of thousands times between the radio frequency signal and the output intermediate frequency signal, a reliable isolation effect can be achieved by means of first-order passive high-pass/low-pass filter networks. FIG. 3 shows the loop gain of the physical loop in the entire frequency domain. It can be seen that the loop gain value at any frequency is lower than 0 dB, which is to say, no oscillation will be produced at any frequency in the frequency mixer.

The structure of the frequency mixer of the present invention is shown in FIG. 2. The frequency mixer employs an input/output full-differential structure. The differential terminals of the transconductance stage are consisted of PM0, NM0, and PM3, NM1. The input radio frequency signal is coupled to the gate electrode of the PMOS transistor and the gate electrode of the NMOS transistor via capacitors at the same time. The radio frequency current generated by the transconductance stage is coupled to the local oscillator stage via small capacitors C4 and C5. The capacitors allow for complete feeding-through of the radio frequency signal, but are similar to an open circuit for the intermediate frequency signal, which is to say, the intermediate frequency signal is blocked before the mixer stage. The mixing stage and transconductance stage are biased separately, so that lower bias current can be used for the mixer stage and thereby the noise factor of the frequency mixer can be improved. The converted signals are output from the drain electrodes of NM2 and NM3, filtered in the first-order low-pass filters to filter off radio frequency signal, and then applied to the gate electrodes of NM0 and NM1. The final intermediate frequency output is generated in the drain electrodes of NM0 and NM1. FIG. 4 shows the curve of conversion gain of the output terminal of the mixer stage (lower curve) and the curve of conversion gain of the output terminal of the trans conductance/amplifier stage (upper curve) with input frequency, wherein, the local oscillator frequency is 2.45 GHz; as can be seen clearly from the figure, due to the introduction of return-type structure, the conversion gain is increased by more than 20 dB with the same power consumption and active components.

Beneficial Effects

The frequency mixer comprises a transconductance/amplifier stage, a mixer stage, and high-pass and low-pass filter networks; the transconductance/amplifier stage employs a current reuse CMOS structure, wherein an input radio frequency signal is converted into radio frequency current; the current is filtered through the high-pass filter network to filter off the low frequency component and then fed into the mixer stage; in the mixer stage, intermediate frequency signal is generated and output under the modulation action of the mixer stage. The intermediate frequency signal is filtered through a low-pass filter network to filter off the high frequency component and then is sent again for input into the transconductance/amplifier stage, amplified by the transconductance/amplifier stage, and then output; the transconductance stage of the frequency mixer employs current reuse technology, and the input radio frequency signal and output intermediate frequency signal share the same transconductance/amplifier stage. Therefore, the frequency mixer of the present invention has advantages of reduced power consumption, simplified circuit structure, and high conversion gain.

BRIEF DESCRIPTION OF THE DRAWINGS

FIG. 1a is a modular block diagram of a conventional frequency mixer;

FIG. 1b is a modular block diagram of the return-type current reuse frequency mixer of the present invention;

FIG. 2 is a schematic circuit diagram of the return-type current reuse frequency mixer of the present invention;

DETAILED DESCRIPTION OF THE EMBODIMENTS

Figure 3:
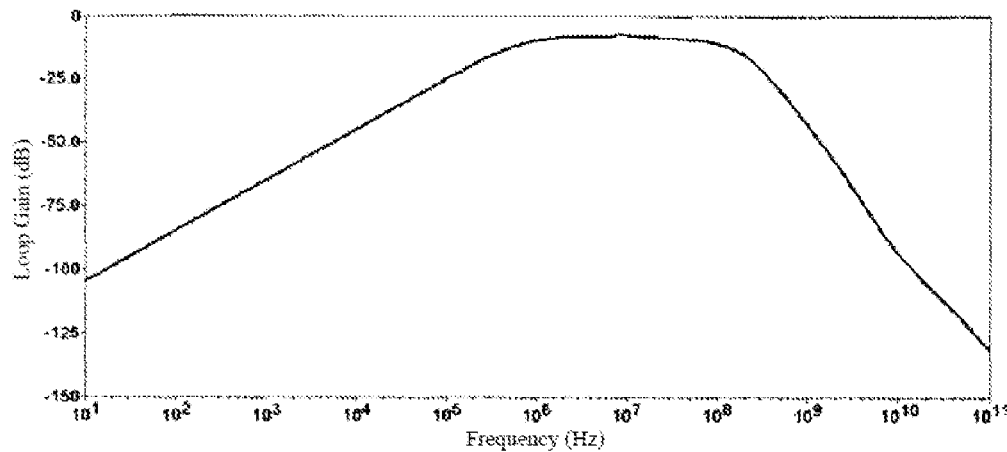
FIG. 3 shows an internal loop gain curve of the return-type current reuse frequency mixer of the present invention in the entire spectral range.
Figure 4:
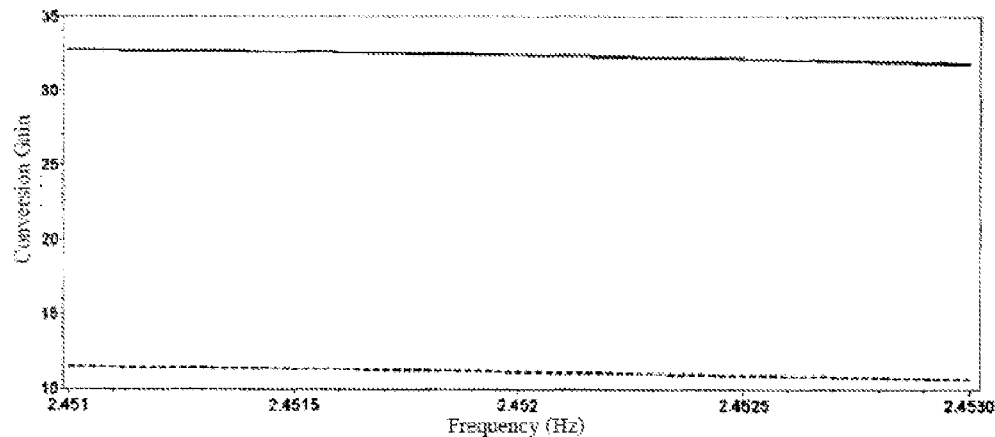
FIG. 4 shows a curve of conversion gain of the output terminal of the mixer stage (lower curve) and a curve of conversion gain of the output terminal of the transconductance/amplifier stage (upper curve) with input frequency, wherein, the local oscillator frequency is 2.45 GHz.
Figure 5:
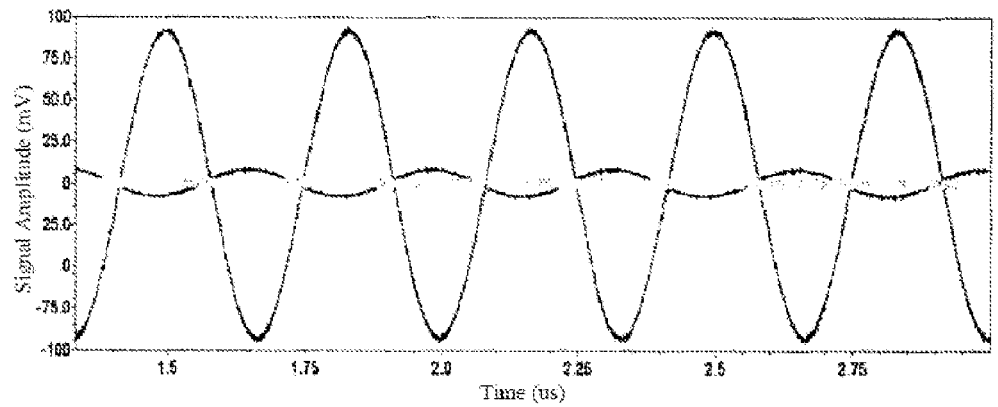
FIG. 5 shows a waveform of input radio frequency signal (curve in light color), a waveform of the output terminal of the mixer stage (low frequency sinusoidal wave with lower amplitude), and a waveform of intermediate frequency signal of the output terminal of the transconductance/amplifier stage (low frequency sinusoidal wave with higher amplitude).

The main structure of the return-type current reuse frequency mixer of the present invention mainly comprises a transconductance/amplifier stage, a mixer stage, biasing circuits, and filter networks, etc. The transconductance/amplifier stage comprises P-channel metal oxide field effect transistors (hereinafter called as PMOS transistors) PM0 and PM3, and N-channel metal oxide field effect transistors (hereinafter called as NMOS transistors) NM0 and NM1. PM0, NM0, and PM3 and NM1 constitute a current reuse transconductance stage. NM0 and NM1 serve as amplifier transistors for the output intermediate frequency signal, and the final output signals are output from the drain electrodes of NM0 and NM1. Double balanced switches PM4-PM7 serve as the core circuit of frequency mixer, and the current bias is provided by bias transistors PM1 and PM2. The DC bias voltage for the transconductance stage is provided by the gate voltage of mixing load transistors NM2 and NM3. Capacitors C4 and C5 are placed between the transconductance stage and the mixer stage, to couple the radio frequency signal and isolate the intermediate frequency output signal. C6, R5, C7, C9 and R6, C8, C10 constitute a low-pass filter network, to couple the intermediate frequency signal output from the mixer stage to the transconductance/amplifier stage and isolate the radio frequency signal output from the mixer stage.

The upper pole plates of capacitors C0 and C1 are connected to the positive signal input terminal, and the lower pole plate of C1 is connected to the gate electrode of PM0; the lower pole plate of C0 is connected to the gate electrode of NM0; the upper pole plates of capacitors C2 and C3 are connected to the positive signal input terminal, and the lower pole plate of C3 is connected to the gate electrode of PM3; the lower pole plate of C2 is connected to the gate electrode of NM1; the source electrode of PM0 is connected to the supply voltage, and the drain electrode of PM0 is connected to the drain electrode of NM0; the positive terminal of resistor R1 is connected to the gate electrode of PM0, the negative terminal of R1 is connected to the positive terminal of resistor R2, and the negative terminal of R2 is connected to the drain electrode of PM0. The source electrode of PM3 is connected to the supply voltage, and the drain electrode of PM3 is connected to the drain electrode of NM1. The positive terminal of resistor R3 is connected to the gate electrode of PM3, the negative terminal of R3 is connected to the positive terminal of R4, and the negative terminal of R4 is connected to the drain electrode of PM3. The negative terminal of R1 and the negative terminal of R3 are connected to the upper pole plate of capacitor C12 simultaneously, and the lower pole plate of C12 is grounded. The drain electrodes of NM0 and NM1 are grounded. The source electrodes of PM1 and PM2 are connected to the supply voltage, and the gate electrodes of PM1 and MP2 are connected to the gate voltage of a current mirror. The source electrodes of PM4 and PM5 are connected to the drain electrode of PM1, and the source electrodes of PM6 and PM7 are connected to the drain electrode of PM2; the positive terminal of local oscillator signal is connected to the gate electrodes of PM5 and PM6, and the negative terminal of local oscillator signal is connected to the gate electrodes of PM4 and PM7. The source electrodes of NM2 and NM3 are grounded, the gate electrodes of NM2 and NM3 are connected to the upper pole plate of capacitor C11, and the lower pole plate of capacitor C11 is grounded. The drain electrode of NM2 is connected to the drain electrodes of PM4 and PM6; the drain electrode of NM3 is connected to the drain electrodes of PM5 and PM6. The upper pole plate of radio frequency coupling capacitor C4 is connected to the drain electrode of PM0, and the lower pole plate of C4 is connected to the drain electrode of PM1; the upper pole plate of radio frequency coupling capacitor C5 is connected to the drain electrode of PM3, and the lower pole plate of C5 is connected to the drain electrode of PM2; the positive terminal of resistor R7 is connected to the drain electrode of NM2, and the negative terminal of R7 is connected to the gate electrode of NM2. The positive terminal of R8 is connected to the drain electrode of NM3, and the negative terminal of R8 is connected to the gate electrode of NM3. The capacitor C6 is bridge-connected between the positive terminal of R7 and the positive terminal of R8. The upper pole plate of capacitor C9 is connected to the drain electrode of NM2, and the lower pole plate of C9 is grounded. The upper pole plate of capacitor C10 is connected to the drain electrode of NM3, and the lower pole plate of C10 is grounded. The positive terminal of resistor R5 is connected to the drain electrode of NM2, the negative terminal of R5 is connected to the gate electrode of NM0 and the upper pole plate of capacitor C7, and the lower pole plate of C7 is grounded. The positive terminal of resistor R6 is connected to the drain electrode of NM3, the negative terminal of R6 is connected to the gate electrode of NM1 and the upper pole plate of capacitor C8, and the lower pole plate of C8 is grounded. The positive terminal of R9 is connected to an output node 1, the negative terminal of R9 serves as the positive terminal for intermediate frequency signal output and is connected to the upper pole plate of capacitor C13, and the lower pole plate of C13 is grounded. The positive terminal of R10 is connected to an output node 2, the negative terminal of R10 serves as the negative terminal for intermediate frequency signal output and is connected to the upper pole plate of capacitor C14, and the lower pole plate of C14 is grounded.

The above content is only preferred embodiments of the present invention, and the protection scope of the present invention is not limited to the above embodiments. Those having ordinary skills in the art should recognize that various variations and modifications can be made according to the disclosure of the present invention without departing from the spirit and scope of the present invention as defined by the accompanying claims.

The invention claimed is:

1. A return-type current reuse frequency mixer, comprising:
    a transconductance/amplifier stage and a mixer stage connected in sequence, the transconductance/amplifier stage amplifies an input radio frequency signal, and the amplified radio frequency signal passes through the mixer stage to produce and output an intermediate frequency signal; the intermediate frequency signal is fed back to an input terminal of the transconductance/amplifier stage and the intermediate frequency signal is also output as a final intermediate frequency signal output after being amplified by the transconductance/amplifier stage; and
    a high-pass filter network is serially connected between the transconductance/amplifier stage and the mixer stage, to block the intermediate frequency signal; a low-pass filter network is serially connected between the output terminal of the mixer stage and the transconductance/amplifier stage, to block the radio frequency signal;
    wherein the transconductance/amplifier stage includes a current reuse stage, and serves as a transconductance stage for the radio frequency signal and an amplifier stage for the intermediate frequency signal.

2. The return-type current reuse frequency mixer according to claim 1, wherein,
    the transconductance/amplifier stage comprises: PMOS transistors PM0 and PM3; NMOS transistors NM0 and NM1; capacitors C0 and C1; capacitors C2 and C3; and, resistors R1, R2, R3 and R4;
    the current reuse stage comprises: PM0, NM0, PM3 and NM1;
    NM0 and NM1 operate to amplify the output intermediate frequency signal simultaneously, and the final output signals are output from the drain electrodes of NM0 and NM1;
    the mixer stage comprises: double balanced switches PM4, PM5, PM6, and PM7; PMOS transistors PM1 and PM2 that are used as bias transistors, wherein, PM4 to PM7 comprise a mixer circuit, and current bias is provided by PM1 and PM2; and, NMOS transistors NM2 and NM3 that are used as mixing loads;
    the transconductance stage receives a DC bias voltage provided by the gate voltage of NM2 and NM3; radio frequency coupling capacitors C4 and C5 are connected between the transconductance stage and mixer stage and serve as a high-pass filter network to couple the radio frequency signal and isolate the final intermediate frequency signal output;
    the low-pass filter network comprises capacitors C6, R5, C7, C9, and R6, C8, C10, to couple the intermediate frequency signal output from the mixer stage to the transconductance/amplifier stage and isolate the radio frequency signal output from the mixer stage;

the capacitors C0 and C1 include upper plates that are connected to the positive input signal terminal, and a lower plate of C1 is connected to a gate electrode of PM0; a lower plate of C0 is connected to a gate electrode of NM0; upper plates of capacitors C2 and C3 are connected to a positive input signal terminal, and lower plate of C3 is connected to a gate electrode of PM3; a lower plate of C2 is connected to a gate electrode of NM1;

a source electrode of PM0 is connected to a supply voltage, and a drain electrode of PM0 is connected to a drain electrode of NM0; a positive terminal of resistor R1 is connected to a gate electrode of PM0, a negative terminal of resistor R1 is connected to a positive terminal of resistor R2, and a negative terminal of R2 is connected to a drain electrode of PM0; a source electrode of PM3 is connected to the supply voltage, and a drain electrode of PM3 is connected to a drain electrode of NM1; a positive terminal of resistor R3 is connected to a gate electrode of PM3, a negative terminal of resistor R3 is connected to a positive terminal of R4, and a negative terminal of R4 is connected to the drain electrode of PM3; the negative terminal of R1 and the negative terminal of R3 are connected to an upper plate of capacitor C12 simultaneously, and a lower plate of C12 is grounded;

the drain electrodes of NM0 and NM1 are grounded; source electrodes of PM1 and PM2 are connected to the supply voltage, and gate electrodes of PM1 and PM2 are connected to a gate voltage of a current mirror; source electrodes of PM4 and PM5 are connected to drain electrode of PM1, and source electrodes of PM6 and PM7 are connected to drain electrode of PM2; the positive terminal of local oscillator signal is connected to the gate electrodes of PM5 and PM6, and a negative terminal of local oscillator signal is connected to gate electrodes of PM4 and PM7;

source electrodes of NM2 and NM3 are grounded, gate electrodes of NM2 and NM3 are connected to an upper plate of capacitor C11, and a lower plate of capacitor C11 is grounded; a drain electrode of NM2 is connected to drain electrodes of PM4 and PM6; a drain electrode of NM3 is connected to the drain electrodes of PM5 and PM6;

an upper plate of capacitor C4 is connected to the drain electrode of PM0, and a lower plate of capacitor C4 is connected to the drain electrode of PM1; an upper plate of capacitor C5 is connected to the drain electrode of PM3, and a lower plate of capacitor C5 is connected to the drain electrode of PM2; a positive terminal of resistor R7 is connected to the drain electrode of NM2, and a negative terminal of resistor R7 is connected to the gate electrode of NM2; a positive terminal of R8 is connected to the drain electrode of NM3, and a negative terminal of R8 is connected to a gate electrode of NM3; the capacitor C6 is bridge-connected between the positive terminal of R7 and the positive terminal of R8; the upper plate of capacitor C9 is connected to the drain electrode of NM2, and a lower plate of C9 is grounded; a upper plate of capacitor C10 is connected to the drain electrode of NM3, and a lower plate of C10 is grounded; a positive terminal of resistor R5 is connected to the drain electrode of NM2, a negative terminal of R5 is connected to the gate electrode of NM0 and a upper plate of capacitor C7, and a lower plate of C7 is grounded; a positive terminal of resistor R6 is connected to the drain electrode of NM3, a negative terminal of R6 is connected to the gate electrode of NM1 and a upper plate of capacitor C8, and a lower plate of C8 is grounded;

a positive terminal of R9 is connected to a first output node, a negative terminal of R9 is a positive terminal of intermediate frequency signal output and is connected to an upper plate of the capacitor C13, and a lower plate of C13 is grounded; a positive terminal of R10 is connected to a second output node, a negative terminal of R10 is a negative terminal of intermediate frequency signal output and is connected to an upper plate of capacitor C14, and a lower plate of C14 is grounded; the first output node is placed at the negative terminal of resistor R2, and the second output node is placed at the negative terminal of resistor R4.

3. The return-type current reuse frequency mixer according to claim 1, wherein the transconductance/amplifier stage comprises: two pairs of series connected transistors; capacitors to filter the RF input to gates of the pairs of transistors; and resistor networks to feed the intermediate frequency signals back to the gates of the pairs of transistors, respectively.

4. The return-type current reuse frequency mixer according to claim 3, wherein the current reuse stage includes the two pairs of series connected transistors.

5. The return-type current reuse frequency mixer according to claim 3, wherein a first output node is intermediate a first pair of series connected transistors and a second output node is intermediate a second pair of series connected transistors.

6. The return-type current reuse frequency mixer according to claim 5, wherein a first resistor network is connected to the first output node and a second resistor network is connected to the second output node.

7. The return-type current reuse frequency mixer according to claim 6, wherein a first transistor of each of the pairs of transistors has a source connected to the supply voltage.

8. The return-type current reuse frequency mixer according to claim 7, wherein a second transistor of each of the pairs of transistors has source connected to ground.

* * * * *